(12) United States Patent
Takemoto et al.

(10) Patent No.: US 7,274,195 B2
(45) Date of Patent: *Sep. 25, 2007

(54) SEMICONDUCTOR DEVICE TEST PROBE

(75) Inventors: Megumi Takemoto, Tokyo (JP);
Shigeki Maekawa, Tokyo (JP);
Yoshihiro Kashiba, Tokyo (JP);
Yoshinori Deguchi, Tokyo (JP);
Kazunobu Miki, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/645,595

(22) Filed: Aug. 22, 2003

(65) Prior Publication Data
US 2005/0189955 A1    Sep. 1, 2005

Related U.S. Application Data

(63) Continuation of application No. 09/810,247, filed on Mar. 19, 2001, now Pat. No. 6,633,176.

(51) Int. Cl.
*G01R 31/00* (2006.01)
(52) U.S. Cl. ..................... 324/754; 324/761; 324/765
(58) Field of Classification Search ........ 324/754–762, 324/72.5, 765; 29/832, 846; 439/482; 430/320
See application file for complete search history.

(56) References Cited

U.S. PATENT DOCUMENTS 5,393,647 A    2/1995    Neukermans et al.
(Continued)

FOREIGN PATENT DOCUMENTS

JP    5-240877 A    9/1993
(Continued)

OTHER PUBLICATIONS

Metallic Plasticity Processing, Maruzen Kabushiki Kaisha, Jun. 25, 1971, pp. 4-11 (with partial English language translation).

*Primary Examiner*—Vinh P. Nguyen
(74) *Attorney, Agent, or Firm*—Buchanan Ingersoll & Rooney PC

(57) ABSTRACT

A semiconductor device test probe having a tip portion for being urged against an electrode pad of an integrated semiconductor device to establish an electrical contact against the electrode pad for testing functions of the semiconductor device. The spherical tip portion has a radius of curvature r expressed by $9t \leq r \leq 35t$, where r is the radius of curvature of the spherical surface and t is the thickness of the electrode pad. The tip portion may have a first curved surface substantially positioned in the direction of slippage of the probe when the probe is urged against the electrode pad and slipped relative to the electrode pad and a second curved surface opposite to the first curved surface. The first curved surface has a radius of curvature of from 7 μm to 30 μm and larger than that of the second curved surface. The test probe may be manufactured by a method comprising the steps of roughing the tip portion of the curved surface by abrasing by means of electrolyte abrasion or abrasing particles to form a symmetrical spherical curved surface, and finishing the tip portion by sliding it on an abrasive member comprising an elastically deformable thick film fixed to a substrate and having abrasive particles therein or thereon directly or through a metallic film.

4 Claims, 13 Drawing Sheets

U.S. PATENT DOCUMENTS

| | | | |
|---|---|---|---|
| 5,500,607 A * | 3/1996 | Verkuil | 324/761 |
| 5,767,691 A | 6/1998 | Verkuil | |
| 6,242,929 B1 * | 6/2001 | Mizuta | 324/754 |
| 6,492,827 B1 * | 12/2002 | Mazur et al. | 324/761 |
| 6,633,176 B2 * | 10/2003 | Takemoto et al. | 324/754 |
| 6,646,455 B2 * | 11/2003 | Maekawa et al. | 324/754 |
| 6,885,204 B2 * | 4/2005 | Takemoto et al. | 324/754 |

FOREIGN PATENT DOCUMENTS

| | | |
|---|---|---|
| JP | 5-273237 A | 10/1993 |
| JP | 05-273237 A | 10/1993 |
| JP | 6-61316 | 9/1994 |
| JP | 7-63785 | 3/1995 |
| JP | 8-115955 A | 5/1996 |
| JP | 8-115956 A | 5/1996 |
| JP | 8-152436 | 6/1996 |
| JP | 08-166407 * | 6/1996 |
| JP | 8-166407 | 6/1996 |
| JP | 08-166407 A | 6/1996 |
| JP | 8-292209 | 11/1996 |
| JP | 10-245881 A | 8/1998 |
| JP | 11-148947 | 6/1999 |
| JP | 11-241690 A | 8/1999 |
| JP | 2000-147004 * | 5/2000 |

* cited by examiner

SLIP DIRECTION

10 μm

SCRUB DIRECTION

SCRUB DIRECTION

1 μm

1 μm

SEMICONDUCTOR DEVICE TEST PROBE

CROSS REFERENCE TO RELATED APPLICATION

This application is a continuation of application Ser. No. 09/810,247, filed on Mar. 19, 2001, now U.S. Pat. No. 6,633,176 and is based on Application No. 10-245881, filed in Japan on Aug. 31, 1998 and Application No. 11-241690, filed in Japan on Aug. 27, 1999, the contents of which are hereby incorporated by reference.

BACKGROUND OF THE INVENTION

This invention relates to a semiconductor device test probe, manufacturing method therefor and a semiconductor device tested by such the probe.

With the conventional test probe as shown in FIG. 13a, the testing (probing) is carried out by attaching a probe 202 having a for and bent into a hook-like shape to a probe card 201 which is vertically movable, and pushing the probe 202 against a test pad of a semiconductor integrated circuit (referred to as an electrode pad herein after) in such a manner than an oxide film on the pad surface is broken off to establish true contact (electrical contact) between the probe and a fresh surface of the pad. The condition of a probe tip under the probing is shown in FIG. 13b. For the sake of easy understanding, FIG. 13b is illustrated in the form of a simplified model with respect to dimensions and the like. As shown in FIG. 13b, the tip 200 of the conventional probe is originally finished to have a flat end face, so that at the time of probing the whole of the flat tip portion is brought into contact and an oxide film 204 and contaminants on the surface of the electrode pad 203 are left interposed between the probe tip and the pad surface.

Further pressing of the probe against the electrode pad to drive it by 50–100 μm further downward (overdrive) causes the inclined tip of the probe to slip and break a portion of the oxide film 204 to make the conducting portion 206 through which an electrical true contact is established, permitting the conduction test to be achieved. At this time, the probe is slightly rotated by flexure. Therefore, in a probe card having a number of probes with a flat finished tip, an angle of the flat surface at the probe tip portion is not equal to each other during the overdriving, thus posing a problem that the contact state is not stable.

Also, in Japanese Patent Laid-Open No. 6-61316, an example is disclosed in which the tip of the probe is formed into a sphere-shape or an oval sphere-shape in order not to damage the electrode pad of the integrated semiconductor device. In this example, differing from the one in which the tip portion is finished flat, any problem due to the deviation of the contacting surface areas does not arise.

Japanese Patent Laid-Open No. 8-166407 discloses an example of a probe for testing lead portions (final test) of a semiconductor device, wherein the radius of curvature r of the tip portion of the probe is made from 0.5R to 5R (R is the diameter of the tip portion of the probe), whereby the contacting area becomes more stable as compared to the case where the tip portion is flat for the reasons the same as that for the foregoing spherical tip portion, thereby to suppressing the temperature rise of the probe and preventing the welding of Sn. Here, the minimum radius of curvature is set at the machining limitation or to be a semi-sphere shape. Also, the reasons for the maximum limit of 5R is explained to be for the purpose of preventing the ridge defined between the side portions and the spherical tip portion from planing the plated Sn.

Japanese Patent Laid-Open No. 5-273237 discloses a structure for bringing the tip of the probe into a line contact with an electrode pad. According to this paper, even if the electrode pad is small, the probe does not fall off from the pad, allowing an accurate measurement, so that the tip portion may preferably have the shape as shown in FIG. 14.

Further, Japanese Patent Laid-Open No. 8-152436 discloses an example as shown in FIG. 15 in which the probe comprises a first surface 207 that becomes parallel to the pad surface when the tip of the probe is brought into contact with the semiconductor pad and a second surface 208 that is parallel to the pad surface during the test. According to this probe, the first surface 207 causes an oxide film on the electrode pad to separate to expose the surface without the oxide film, thereby to ensure the good contact state. The second surface is three times larger than the first surface, ensuring the sufficient contact surface area.

Also, since tungsten used as the probe material is made of sintered powder material, the finishing of the tip shape is often achieved by the electrolytic abrasion, but since agglutination can easily take place when the surface coarseness is large, the forgoing Japanese Patent Laid-Open No. 8-166407 proposes a measure for decreasing the surface coarseness by selecting a suitable electrolytic conditions. Also, the effectiveness of polishing the tip into a mirror surface is disclosed also in Japanese Patent Laid-Open No. 8-152436.

Since the conventional probe is constructed as above and the true contact area between the tip portion of the probe and the electrode pad at the time of test (electrically conductive portion 206) is extremely small, a sufficient conduction was some times not properly provided. Also, the repeated probing causes the oxide films 204 to build up on the tip portion 200 of the probe, the true contact surface area relative to the electrode pad is decreased, making the electrical conduction unstable.

Also, even though the stress may be decreased by making the tip portion spherical, the oxide film cannot sufficiently be removed, so that a sufficient true contact surface area cannot be maintained. That is, even when the contact surface is made large, the remains of the aluminum oxide film immediately below the spherical surface impedes the stable contacting and it is necessary to rather frequently remove the aluminum oxide that attaches to the tip portion as the number of times of contacts increase.

In the structure for achieving the separation of the oxide film and the establishment of a true electrical contact by different respective tip surfaces such as shown in FIG. 15 which is an arrangement suggested to solve the problem of residual oxide film, it was found that, while good results were obtained at the initial state, some probes generate poor contacts as the number of times of contacts increases. As a result of the observation and the analysis of the state of the probes in connection with this problem, it was found that when the second contact surface is brought into contact with the electrode pad and repeat this test several times, the second contact surface has aluminum attached thereto, which increases the contact resistance when oxidized. The above assumption is considered reasonable from the fact that this phenomenon generated more often after the exchange of the semiconductor wafer and the halt of the line, i.e., when the test is interrupted for more than several minutes. It is considered that the reason some probes generated poor contacts and some other did not is because the contact surfaces have different from angles in view of the fact that the number of probes are simultaneously brought into contact with the electrode pads, so that it is difficult in the arrangement shown in FIG. 15 to work the first and the second flat surfaces to precision and posed problem in multi-pin measurement which will be more often required in the future.

Another problem was that aluminum which is the electrode material penetrates into polishing scars generated during the probe surface polishing and this aluminum oxides to cause improper contact. It was also found that, since the tungsten probe material has cavity holes therewithin because of it being a sintered body, aluminum enters into the cavities and oxidize, leading to a poor contact.

Also, when the wire bonding is achieved to the semiconductor device after it is tested by the probes, the probe trace causes the yield of the bonding to be decreased. Particularly, when the electrode pad is made small and at the same time the bonding size is made small to make the semiconductor device small in order to increase the number of semiconductor device taken per one wafer, the size of the probe trace is desired to be small which disadvantageously affects the electrical contact, resulting in that the bonding yield was decreased.

The chief object of the present invention is to provide a new and improved semiconductor device test probe free from the above discussed problems of the conventional test prove.

An object of the present invention is to provide a semiconductor device test probe in which the true contact surface area between a probe tip portion and an electrode pad can be increased and a sufficient reliable electrical connection with a minimum probe sliding amount can be established.

Another object of the present invention is to provide a semiconductor device test probe which is maintenance free in the sense that electrode material does not stick to it.

A further object of the present invention is to provide a method for manufacturing a semiconductor device test probe for manufacturing a test probe in which the true contact surface area between a probe tip portion and an electrode pad can be increased and a sufficient reliable electrical connection with a minimum probe sliding amount can be established.

Another object of the present invention is to provide a manufacturing method for a semiconductor device test probe which is maintenance free in the sense that electrode material does not stick to it.

A still another object of the present invention is to provide a method for manufacturing a semiconductor device test probe for manufacturing a test probe in which the true contact surface area between a probe tip portion and an electrode pad can be increased and a sufficient reliable electrical connection with a minimum probe sliding amount can be established.

Another object of the present invention is to provide a reliable semiconductor device tested by the probe of the present invention.

SUMMARY OF THE INVENTION

With the above objects in view, the present invention resides in a semiconductor device test probe having a tip portion for being urged against an electrode pad of an integrated semiconductor device to establish an electrical contact between the tip portion and the electrode pad for testing a function of the semiconductor device. The tip portion defining a spherical surface has a radius of curvature r expressed by $9t \leq r \leq 35t$, where r is the radius of curvature of the spherical surface and t is the thickness of the electrode pad.

The tip portion defining a spherical surface may have a first curved surface substantially positioned in the direction of slippage of the probe when the probe is urged against the electrode pad and slipped relative to the electrode pad and a second curved surface opposite to the first curved surface. The first curved surface has a radius of curvature of from 7 μm to 30 μm and larger than that of the second curved surface.

The semiconductor device test probe may be manufactured by a method comprising the steps of roughing the tip portion of the curved surface by abrasing by means of electrolyte abrasion or abraising particles to form a symmetrical spherical curved surface, and finishing the tip portion by sliding it on an abrasive member comprising an elastically deformable thick film fixed to a substrate and having abrasive particles therein or thereon directly or through a metallic film.

The surface roughness of the tip portion of the probe may be equal to or less than 0.4 μm.

The tip portion of the probe may comprise fine grooves extending in the direction of scrub of said probe against said electrode pads.

The method for manufacturing the semiconductor device test probe may comprise the steps of working curved surface of the tip portion into a substantially spherical curved surface by abrading by means of electrolyte abrasion or abraising particles to form a symmetrical spherical curved surface, and inserting or moving the tip portion into the abrasive particles or on a resin including the abrasive particles to form fine grooves extending in the direction of scrub of the probe against the electrode pads.

The probe may be made of a metallic material made from a powdery material, and the probe is heat treated, the heat treatment conditions being a non-oxidizing atmosphere, at the treatment temperature of equal to or less than the recrystallization temperature of the metallic material and the non-oxidizing gas is pressurized.

The present invention also resides in a semiconductor device tested by the above semiconductor device test probe, wherein the test is achieved by urging the probe against the electrode pad of the semiconductor device, providing a relative sliding movement between the probe and the electrode pad to expel the electrode pad material by making a lamination stack.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 1A:
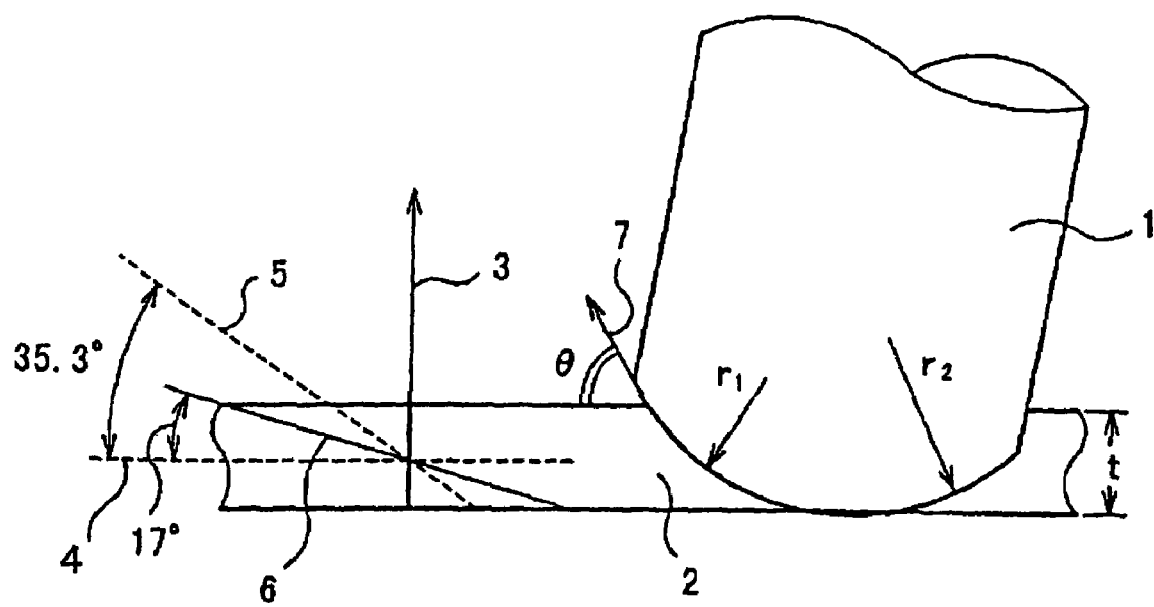
FIG. 1a is an explanatory view showing the state of the prove and the electrode pad of the first embodiment of the present invention.
Figure 1B:
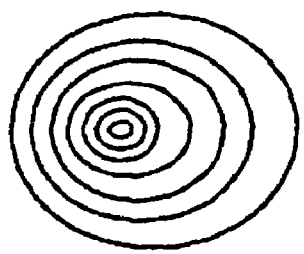
FIG. 1b is an explanatory view showing the contour of the curve surface of the tip portion of the probe of the first embodiment of the present invention.
Figure 2:
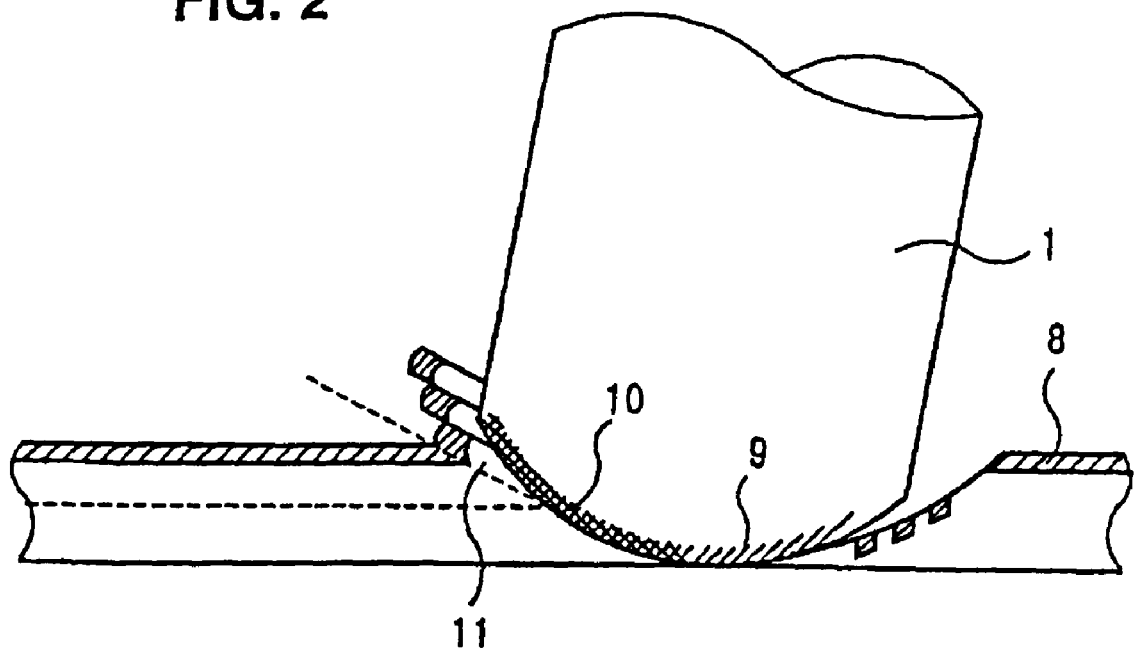
FIG. 2 is an explanatory view showing the state of the prove and the electrode pad of the first embodiment of the present invention.

FIGS. 1a, 1b and 2 illustrates the probe 1 and the electrode pad 2, which is a film of Al—Cu of a thickness of the order of 0.8 μm for a typical logic integrated semiconductor device such as DRAM. The electrode pad may be 2–3 μm for a special purpose semiconductor device such as a power device. The reference numeral 3 shows the crystalline orientation of the electrode pad, 4, 5 and 6 are slip surfaces, 7 a tangent vector of the probe tip, 8 an oxide film on the electrode pad surface, 9 an oxide film attached to the probe, 10 an electrically conducting portion and 11 are sheared pieces.

As illustrated in FIG. 2, the electrical conduction portion between the probe 1 and the electrode pad 2 can be obtained by sliding the probe 1 at the time of probing on the oxide film 8 and breaking the oxide film 8 on the electrode pad 2, thereby bringing the probe 1 into contact with the fresh surface of the electrode pad 2. The probe 1 is not vertical to the surface of the electrode pad 2, but is illustrated as being tilted by 8 degrees, which tilt angle generates a relative slippage between the probe 1 and the electrode pad 2. FIG. 1b illustrates a contour as viewed from the bottom of the probe 1, from which it is seen that the tip portion is composed of a first curved surface of a radius of curvature r1 of which contour lines are dense and a second curved surface of a radius of curvature r2 of which contour lines are spares, these two curved surfaces constitute a continuous spherical surface.

In the conventional technique, there was no proposition that proposes suitable configurations and materials for the probe tip by making the mechanism of the phenomenon clear from the view point of deformation due to the contact between the probe tip and the aluminum pad. Therefore, an intensive study and experiments were conducted on the process for easily generating the shear and for preventing the attachment of aluminum. The shear deformation generates along the slip surface of the metallic crystalline surface. On the other hand, the crystalline direction 3 of the electrode pad 2 at the time of spattering is (111) which is the so-called C-axis orientation. The angle this slip surface 4 of (111) make with respect to the electrode pad is zero degree. Also, the slip surface 5 that has the smallest angle with respect to the electrode pad surface are (110), (101) and (011), of which angle is 35.3 degrees. If the shear generates only at the angles of slip surfaces, then the shears generate only at incremental angles such as 0 degree or 35.3 degrees.

However, it was determined from the experimental results that the shears generate at an angle intermediate between the slip surfaces 4 and 5 and not at incremental angles. This is believed because shears that occur along the above slip surfaces 4 and 5 are combined and resulted in a shear 11 as shown in FIG. 2. Once a slip is generated in the direction of the slip surface 4 (0 degree), the slip pieces in this direction are subjected to a compression force in the 0 degree and prevented from further slipping from that position. Therefore, the slip in the direction of 35.3 degrees takes place more easily than the slip in the direction of 0 degree, so that the slip that takes place next is the slip in the direction of 35.3 degrees. When the angle θ between the probe tip and the pad surface shown in FIG. 1a is less than 35.3 degrees, the slip pieces are pushed into a narrower space, resulting in that a further slippage is prevented. In this state, the slip in the direction of 0 degrees is easier to take place that the slip in the direction of 35.3 degrees, forming the slip in the direction of 0 degree. Therefore, the slips of 0 degree and 35.3 degrees are repeatedly generated and, as a result of this combination, the shears of an angle intermediate between 0 degree and 35.3 degrees are formed.

According to an experiment in which the angle of the tangential direction 7 of the probe tip was changed, the angle between the tangential direction 7 of the probe tip and the electrode pad surface at which the above shearing can take place is from 15 degrees to 35 degrees and a stable shearing takes place at from 17 degrees to 30 degrees. Therefore, when the tip configuration of the probe tip is such that the angle defined between the tangential direction vector 7 of the probe tip and the electrode pad surface is from 15 degrees to 35 degrees and preferably from 17 degrees to 30 degrees, the oxide film 8 on the surface of the electrode pad can be broken and establish a good contact with the fresh electrode pad surface to obtain a sufficient electrical conduction. The relationship between the radius of curvature r of the probe tip and the thickness t of the electrode pad which can provide the above discussed tangential angle can be expressed by 6t≦r≦30t and 8t≦r≦23t. Such the phenomenon can be seen in common in metals of face centered cube lattice such as Al, Au, Cu, Al—Cu alloy, Al—Si and the like.

Figure 3:
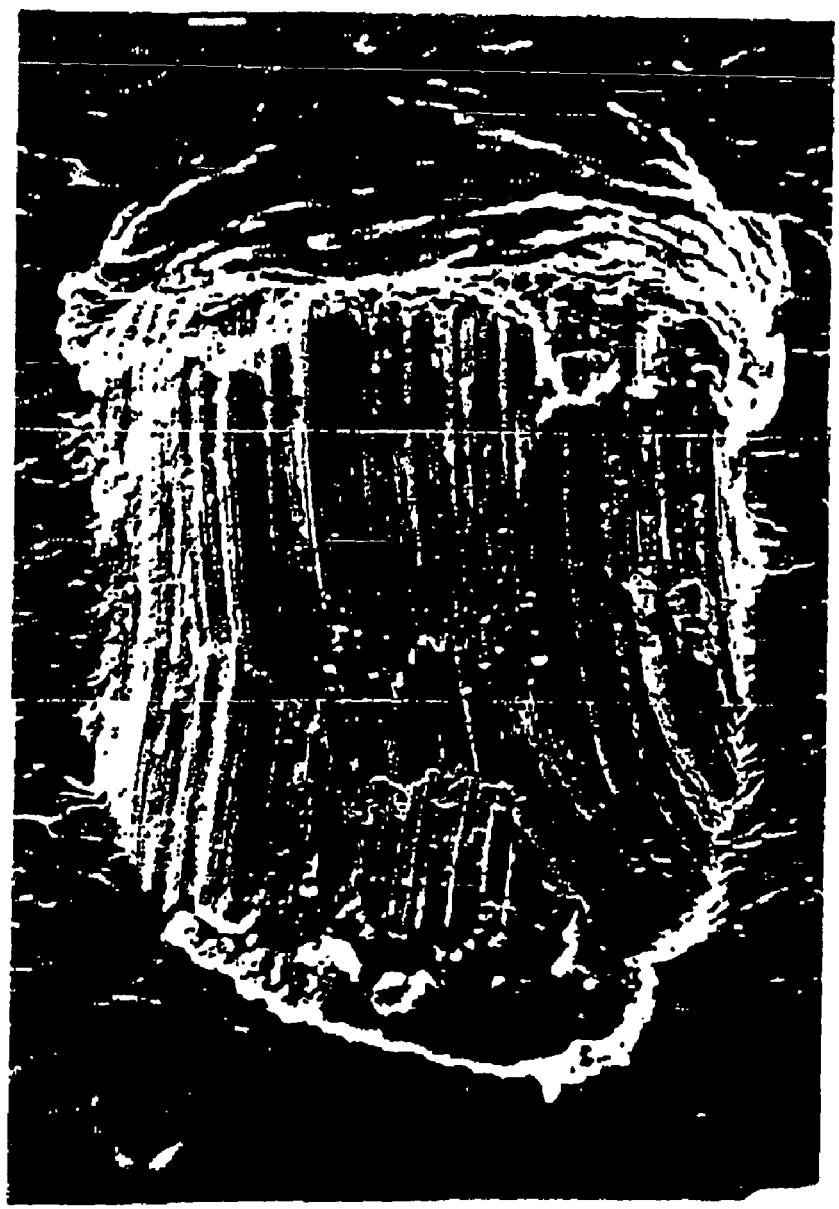
FIG. 3 is an explanatory view showing the probe trace on the aluminum electrode pad formed by the probe of the first embodiment of the present invention as compared to the case where a general probe was used.
Figure 4:
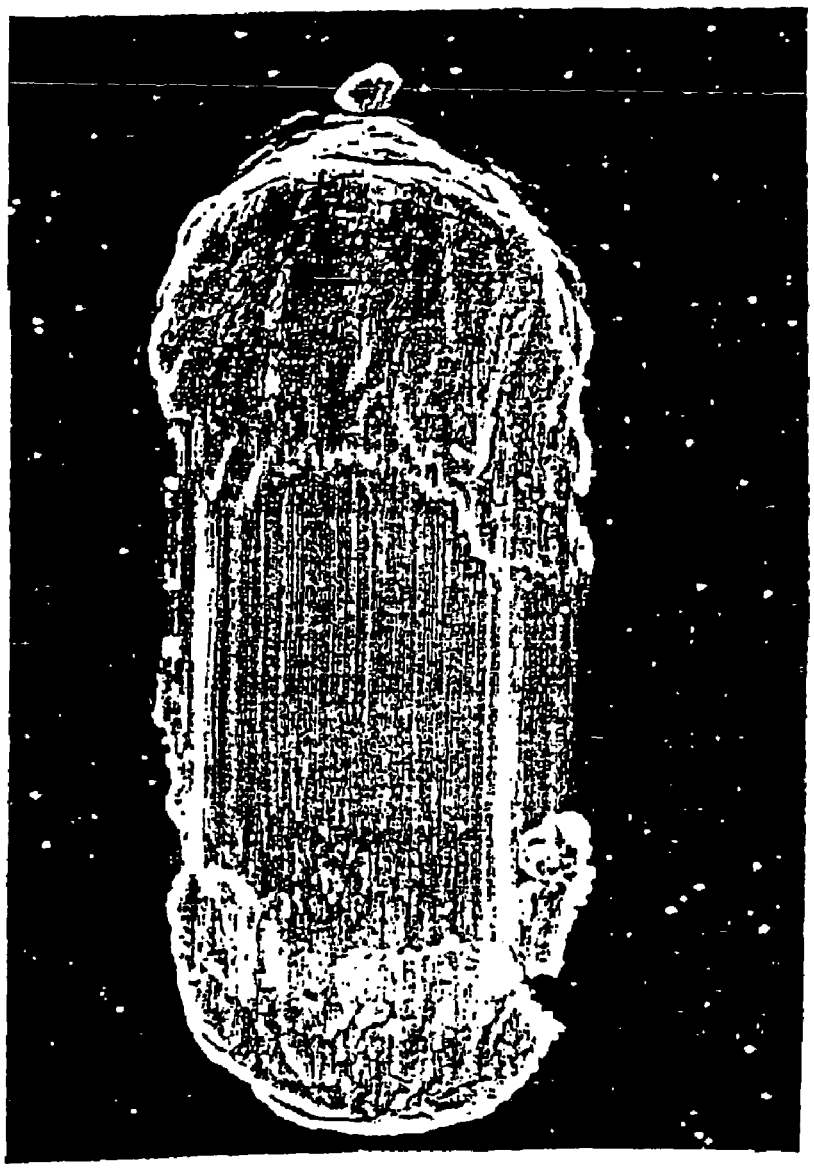
FIG. 4 is an explanatory view showing the probe trace on the aluminum electrode pad formed by the probe of the first embodiment of the present invention as compare to the case where a general probe was used.

FIG. 3 illustrates the probe trace generated on the aluminum pad 2 through the use of the probe 1. Since the aluminum 31 sheared and purged by the probe has the laminar structure, it is determined that the probe tip portion has caused the series of shearing deformations in the test pad material. The above laminar structure is laminated to have a thickness (about 1.5 μm in this example) greater than the thickness of the aluminum pad of 0.8 μm, and the removal configuration is that projections are formed in front of the probe tip portion on the aluminum pad as viewed in the direction of slip of the probe, An example of a removal configuration according to the conventional technique is shown in FIG. 4, from which it is seen that substantially no removal is achieved in the forward direction.

It is now clear from the analysis of the contact mechanism and the observation of the removal state that the problems raised when the probe tip is flat or a spherical surface has a large radius of curvature can be explained by the following two phenomena. First, the projection formed due to the removal of the electrode pad material in the forward direction as viewed in the probe slipping direction and the electrical contact is established under or rear of the probe tip portion. However, the slip surface direction and the pressurizing direction are not coincide under or the rear of the probe, so that the fresh surface cannot easily be formed. That is, the oxide film remains between the needle and the electrode pad. Therefore, by making the contact surface area large, an electrical contact is maintained even when the fresh surface is only a small portion. Secondly, when the fresh surface is formed, another problem of the attachment of aluminum to the probe raises. When this aluminum oxides and could not be removed at the time of next probing, the electrical contact is improper.

Figure 5A:
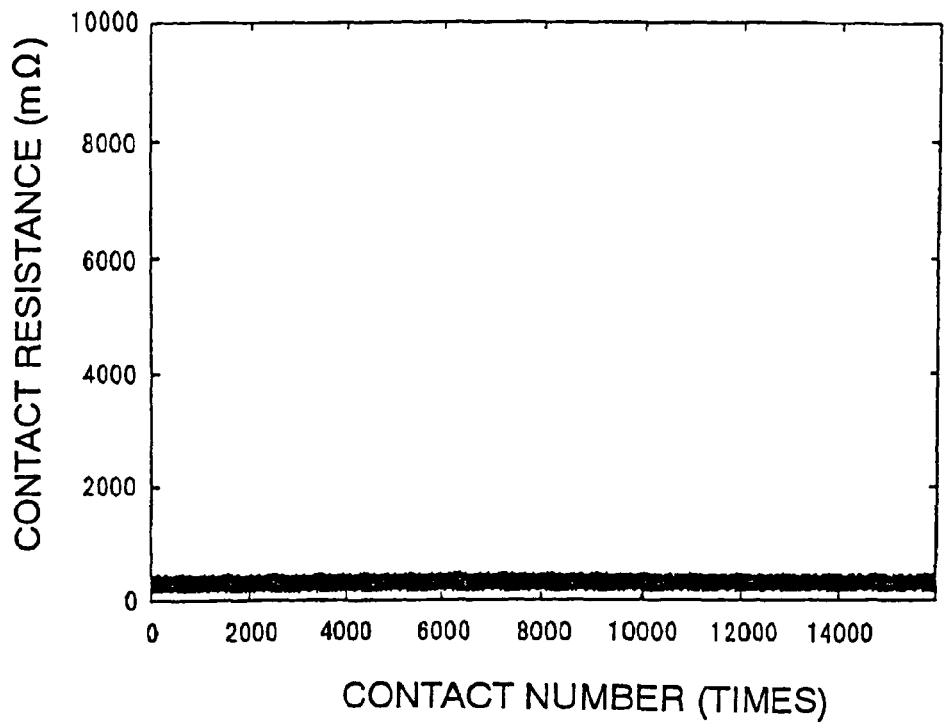
FIG. 5a is an explanatory view showing the contact stability when the probe of the first embodiment of the present invention was used.
Figure 5B:
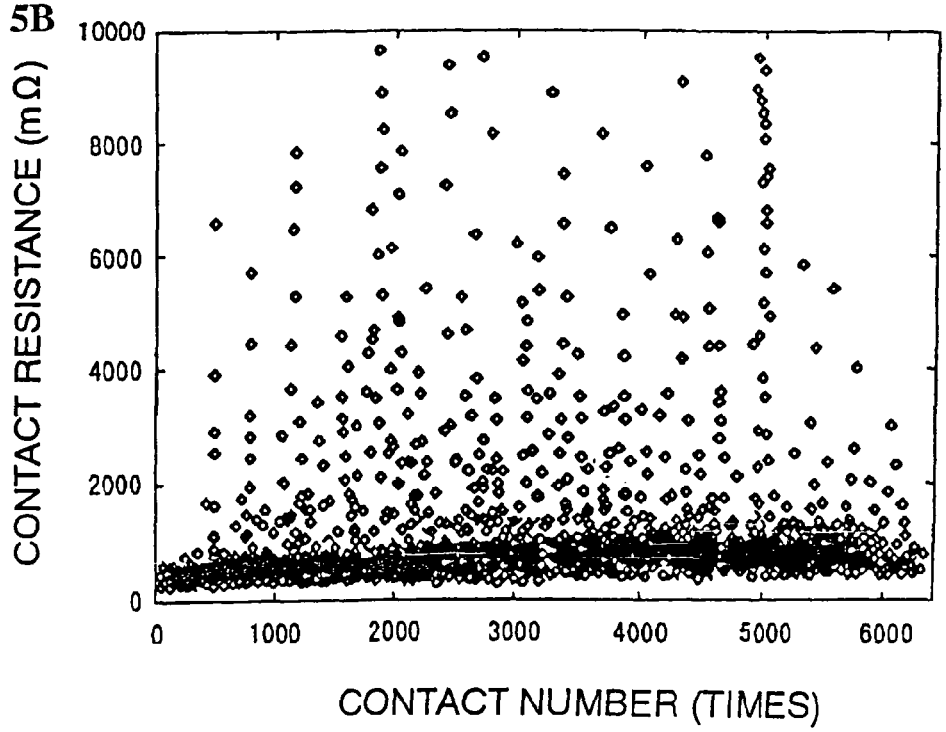
FIG. 5b is an explanatory view showing the contact stability when a typical example of a conventional probe was used.

On the other hand, according to the present invention, the contact angle defined between the electrode pad surface and the probe is set so that the slip is easily generated and the fresh surface is formed at the forward face of the probe to establish an electrically intimate contact surface therethrough because of the force in the longitudinal direction of the probe is applied. Although aluminum attaches to this surface as in the conventional technique, it is positioned in the direction of the slip of the probe at the next probing, so that it is removed by a massive separating force applied at that time, whereby a fresh surface is always maintained. Accordingly, the residual aluminum is located at the position close to the side surface of the second curved surface where no electrical contact is necessary. FIGS. 5a and 5b are graphs showing the results of the conduction tests of the probe of the present invention and the conventional probe, respectively. According to the graph of FIG. 1a, it is seen that no failure of electrical conduction occurred even when the contact of 15000 times were carried out, while with the conventional probe as shown in FIG. 1b the improper contacts having the resistance of more than 1 ohm generated even at the contact of 500th times.

According to the present invention, a trace of slip of the probe on the electrode pad of the semiconductor device is formed and particularly the laminar stack of removed material is formed at the forward end of the trace. While the probe trace is formed with the conventional probe, it is desired to be smaller for the subsequent wire-bonding step. In particular, for the smaller semiconductor devices, the electronic circuitries are highly integrated and the wiring pattern width as well as the electrode pads is getting smaller. However, it was not possible to make the probe trace smaller with the conventional probe because the reliability of the electrical contact becomes worse. This is because the electrical contact is established at the bottom surface of the probe tip. Therefore, it has been necessary for the probe trace to have a width of the order of 20 μm and a length of the order of 40 μm (see FIGS. 3 and 4) and, when the contact is not stable, the probe has been applied for the probing to the same electrode pad, resulting in a still larger probe trace.

According to the present invention on the other hand, the probe trace can be made as small as to have a width of 12 μm and a length of 20 μm. Also, the observation of the bonded portion of the wire-bonding has revealed that the alloy layer which is the index of the stability of the bonding on the probe trace is not sufficiently formed and that the difference in size of the probe trace significantly affects the quality of the wire bonding. That is, the size of the wire-bonding portion is set to be a circle of a diameter of 65 μm for an electrode pad of 80 μm at one side. For the compact semiconductor device in the future, the one side of the electrode pad should be 65 μm and the bonding area should have a diameter of about 55 μm. The area of the probe trace was 800 μm² for the conventional probe and 240 μm² for the probe of the present invention, so that the probe trace according to the conventional probe is sufficiently large in comparison with the bonding area of 2400 μm² for the small electrode pad (55 μm diameter) to deteriorate the quality of bonding, whereas in the present invention in which the probe trace area is 240 μm² which is about ⅓ of that according to the conventional probe, generating no deterioration in bonding. For a small electrode pad and particularly in the long-term reliability, about 5% of the probe traces were improper in poor opening with the conventional probe, whereas in the present invention there were no failure.

If the radius of curvature of the probe tip is made small, the pressure applied to the electrode pad becomes high and generates damages (cracks) to the electrode pad. Usually, the probe is pressed against the semiconductor device with a force of the order of 7 gf and, if the force is decreased to 3 gf for example in correspondence with the reduced contact surface area, the poor contact was formed. This is because the conventional probe is designed so that a sufficient electrical conduction can be established even when the fresh surface is small due to the deviation. With a small contact surface area, the fresh surface area is also small and fluctuated in relation thereto, resulting in the poor contacts. Therefore, it was determined that the arrangement of the probe is effective for the prevention of the damages to the electrode pad in which, as in the present invention, the front of the probe as viewed in the direction of slip of the probe is configured for an easy formation of the fresh surface of the electrode pad (a spherical curved surface of a radius of curvature r1), while the area of the bottom surface (a spherical curved surface of a radius of curvature r2) out of the front surface and the bottom surface for supporting the probe pressure is made large. That is, in the present invention, the electrical contact is ensured at the front surface or the first curved surface and the stress is decreased by the bottom surface or the second curved surface. At that time, since the arrangement is such that the probe slightly flex and rotate by the overdrive to make thee contact surface area at it maximum at the time of overdrive completion at which the probe pressure is the highest, the pressure applied to the electrode pad can be lowered.

Also, by making the tip portion spherical, the contacting surface area is advantageously stable differing from the flat surface heretofore proposed even when the height of the individual probes is different (usually deviation of 10 µm or so is observed). The final load applied to the probe when the probe is pushed by a predetermined amount of over-drive can be set at a desired value by suitably selecting the thickness or length of the probe. However, the load inevitably increases as the over-drive progresses. Since the present invention is arranged such that contact area between the probe tip and the electrode pad increases as the progress of the over-drive, the pressure applied to the semiconductor device does not increase even when the height of the probe has deviation, whereby the damages to the electrode pad can be prevented.

It is to be noted that while the tilt angle of the probe 1 is made 8 degrees in the above conduction tests, the angle for the typical probe is of the order of 6 degrees, and a good result can be expected with regard to the contact stability even with this angle. However, it is desirable to make the tilt angle larger in order to prevent the damages since the contact area is limited to be small in the present invention and, taking the dislocation of the probe from the electrode pad 2 into consideration, the preferable tilt angle is within a range of from 8 degrees to 12 degrees.

Figure 6A:
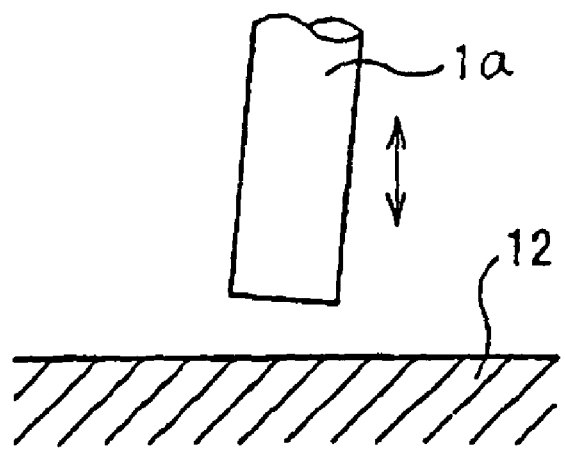
FIG. 6a is an explanatory view showing the probe prior to rounded.
Figure 6B:
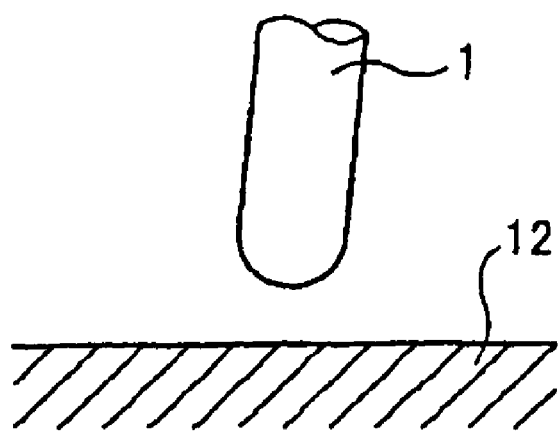
FIG. 6b is an explanatory view showing the probe abraded by the electrolytic liquid.
Figure 6C:
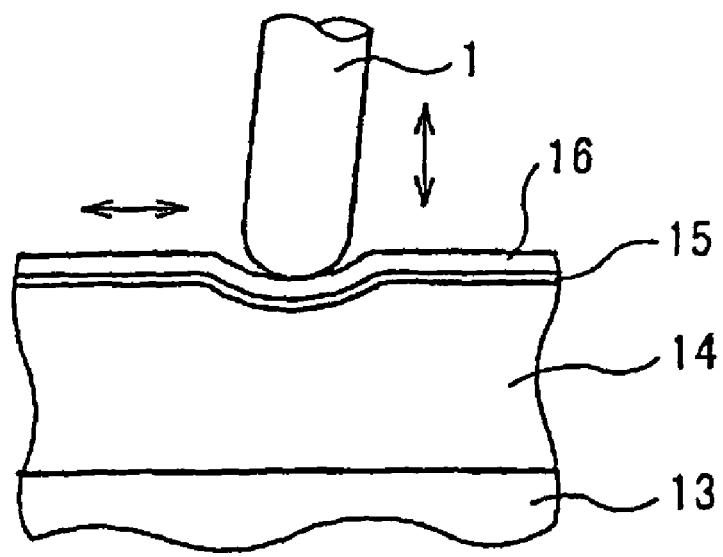
FIG. 6c is an explanatory view showing the probe being polished.

The above-described first curved surface and the second curved surface can be easily formed at the tip portion of the probe by the novel manufacturing method as described below in conjunction with FIGS. 6a to 6c. In FIG. 6a, a rod material 1a of the probe 1 is dipped at its tip into an electrolyte liquid 12 to form the probe having a substantially axially symmetrical spherical surface at its end as shown in FIG. 6b. Alternatively, the Si abrasive particles may be used to form a the spherical surface. Then the probe 1 is further polished or finished by an abrasion device shown in FIG. 6c to have a first curved surface of a first radius of curvature and a second curved surface of a second radius of curvature smaller than the first radius of curvature to form an axially asymmetric curved surface. The abrasion device may have an elastically deformable thick film of abrasive material, such as a film containing abrasive therein, a film having the abrasive attached on the surface or elastic deformable thin film attached through a metallic film. It is seen that the abrasion device shown in FIG. 6c comprises a base member such as a silicon substrate 13, an elastic layer such as a polyimide sheet 14 attached to the silicon substrate 13, a thin Ti film 15 disposed on the polyimide sheet 14 and an abrasive material layer 16 such as TiN film formed on the Ti film 15. The polyimide layer 14 may have a thickness of 50 µm and may be made by coating or bonding. The Ti film 15 may be 100 Å thick and the TiN film may be 2 µm. Alternatively, a thick resin layer containing Si abrasive particles having a thickness of 300 µm for example may be directly attached to the silicon substrate 13 and used as the abrasive material.

In order to polish the spherical tip portion of the probe 1, the probe 1 is attached to the probe card and pressed against the abrasive material 16 under pressure and repeatedly moved up and down with an over-drive amount, such as several 100 µm, greater than the over-drive amount at the time of the wafer test. The tip of the probe attached to the probe card at an angle therewith is forced to make a sliding movement along the abrasive member due to the vertical movement of the probe card. The probe tip portion is embraced by the elastically deformed abrasive to allow the second curved surface having the second radius of curvature r2 to be formed. The radius of curvature r2 can be adjusted by the thickness of the abrasive member and the elasticity. When the probe may be first moved along the surface for a predetermined distance after it is brought into contact with the abrasion device and then moved back and forth about this new position on the abrasion device, the second curved surface can be more selectively polished.

The abrasion member may be made by directly securing the abrasive material to a low-rigidity material attached to a high-rigidity substrate or by securing a thick resin film of low rigidity and containing abrasive material to a rigid substrate instead of the above-described material and structure. It should be noted that the probe should be able to move on the abrasion device with the surface of the device slightly elastically depressed or penetrate into the abrasive material during the movement or, preferably, the probe slides along the surface of the elastic abrasive member, whereby the tip portion can easily be provided with a surface having a different radius of curvature.

Figure 7:
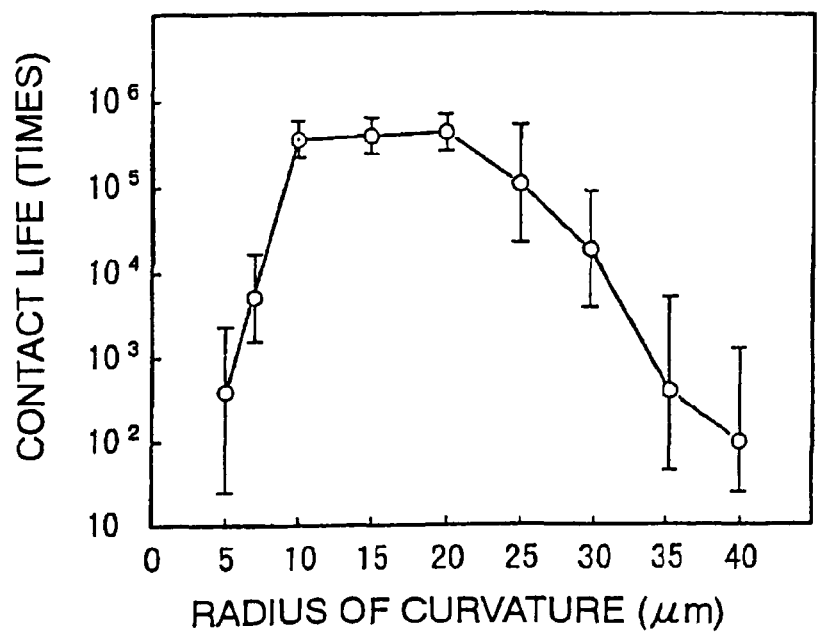
FIG. 7 is a graph showing the relationship between the radius of curvature of the probe of the first embodiment of the present invention and the number of times of contact.

The contact stability is significantly changed according to whether or not the shear deformation of the electrode pad can be easily generated even with the same spherical surface. FIG. 7 illustrates the test results of contact lifetime against various radius of curvature with an electrode pad of 0.8 µm thickness of a typical integrated semiconductor device such as a DRAM. It is seen from the graph that good results of the contact life time can be obtained with the radius of curvature of from 7 to 30 µm, preferably from 10 to 20 µm. The radius of curvature of equal to or less than 7 µm is too small to transmit a sufficient force to the first surface of the electrical conduction surface and the surface area is small, and the upper limit of from 20 to 30 µm substantially coincide with the upper limit of 24 µm where the shear of the electrode pad generate.

While the thickness of the electrode pad changes, the suitable radius of curvature r1 also changes accordingly and the radius of curvature r1 should satisfy $$9t \leq r1 \leq 35t$$

While the probe tip portion of the present invention has been described as being a spherical surface for an easy explanation of the relationship between the angle of slip in which the shearing deformation of the electrode pad takes place, the tip portion may not be a perfect sphere and a similar results can be obtained with a curved surface configuration close to a sphere.

Also, while the Al—Cu alloy has been explained as an example of the test pad material, the similar advantageous results can be obtained when the electrode pad material is aluminum, Al—Si—Cu alloy, copper or the like which exhibits sip deformation (shear deformation) similar to that of aluminum.

Figure 8:
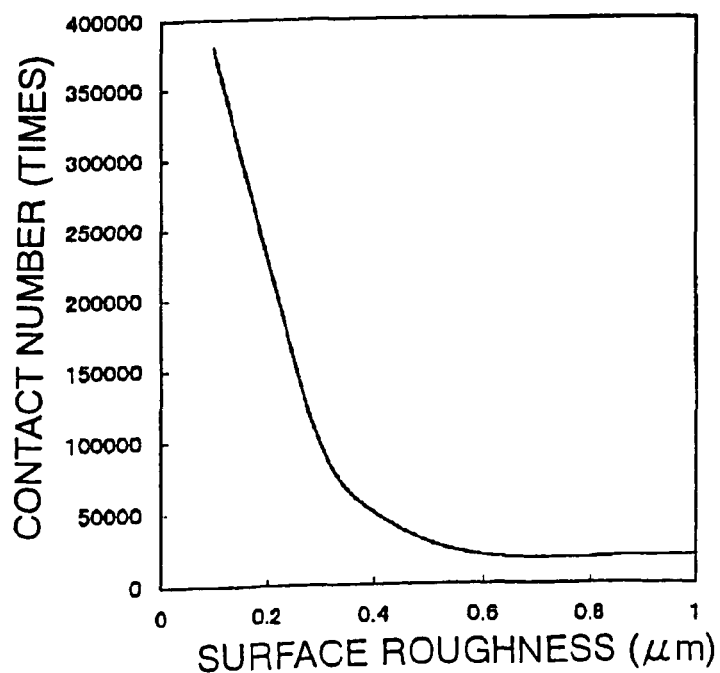
FIG. 8 is a graph showing the relationship between the surface roughness of the probe of the second embodiment of the present invention and the number of times of contact at which the contact resistance exceeds 1 ohm.

FIG. 8 is a graph showing the relationship between the surface roughness of the probe of another embodiment of the present invention and the number of times of the contact, the test being conducted on a DRAM of which electrode pad having a thickness of about 0.8 µm with a probe having a radius of curvature of tip portion of 15 µm. From the graph, it is seen that when the surface roughness is as high as 1 µm the life is about 20,000 times of contacts, whereas when the surface roughness is lowered by the electrolytic abrasion for example, the number of the contact times is abruptly increased when decreased to or below 0.4 µm. Particularly, the number of contacts reached as high as 380,000 times at 0.1 µm, which is about 20 times higher than that when the surface roughness is 1 µm. The reason for this is considered that it becomes difficult for the oxide to attach to the tip of the probe, and similar results were obtained even when the thickness of the electrode pad or the radius of curvature of the probe tip is changed within the range indicated in the above-described first embodiment.

Figure 9A:
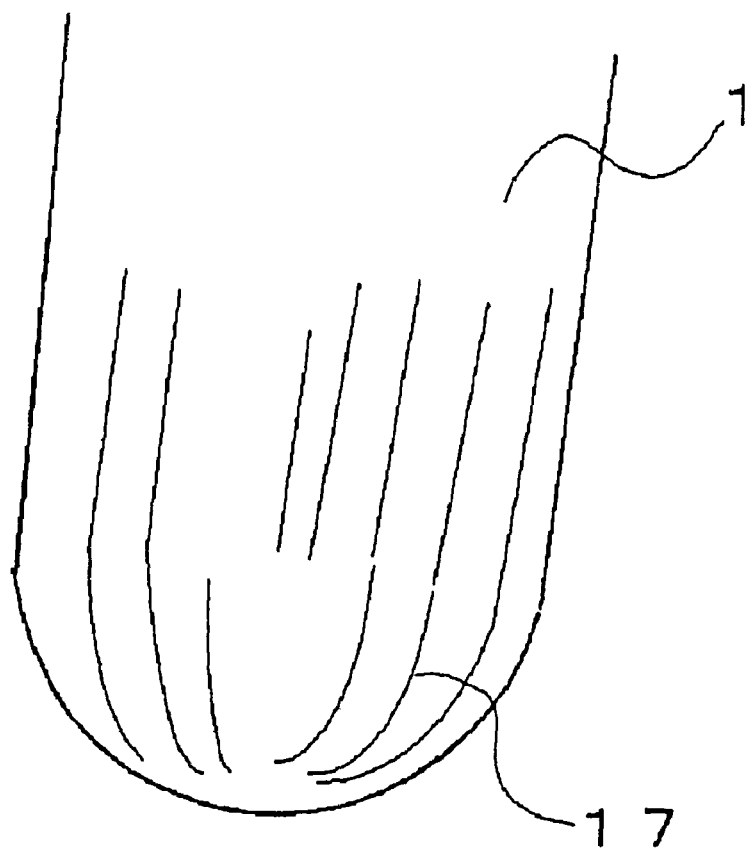
FIG. 9a is an explanatory side view of the probe of the third embodiment of the present invention.
Figure 9B:
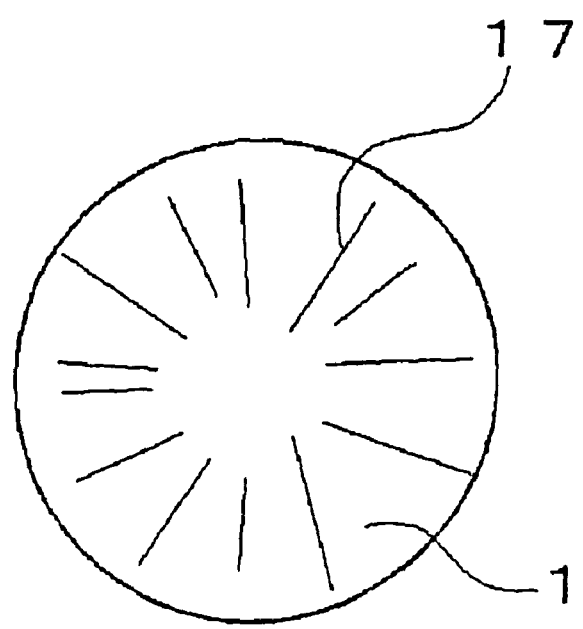
FIG. 9b is an explanatory bottom view of the probe of the third embodiment of the present invention.
Figure 10:
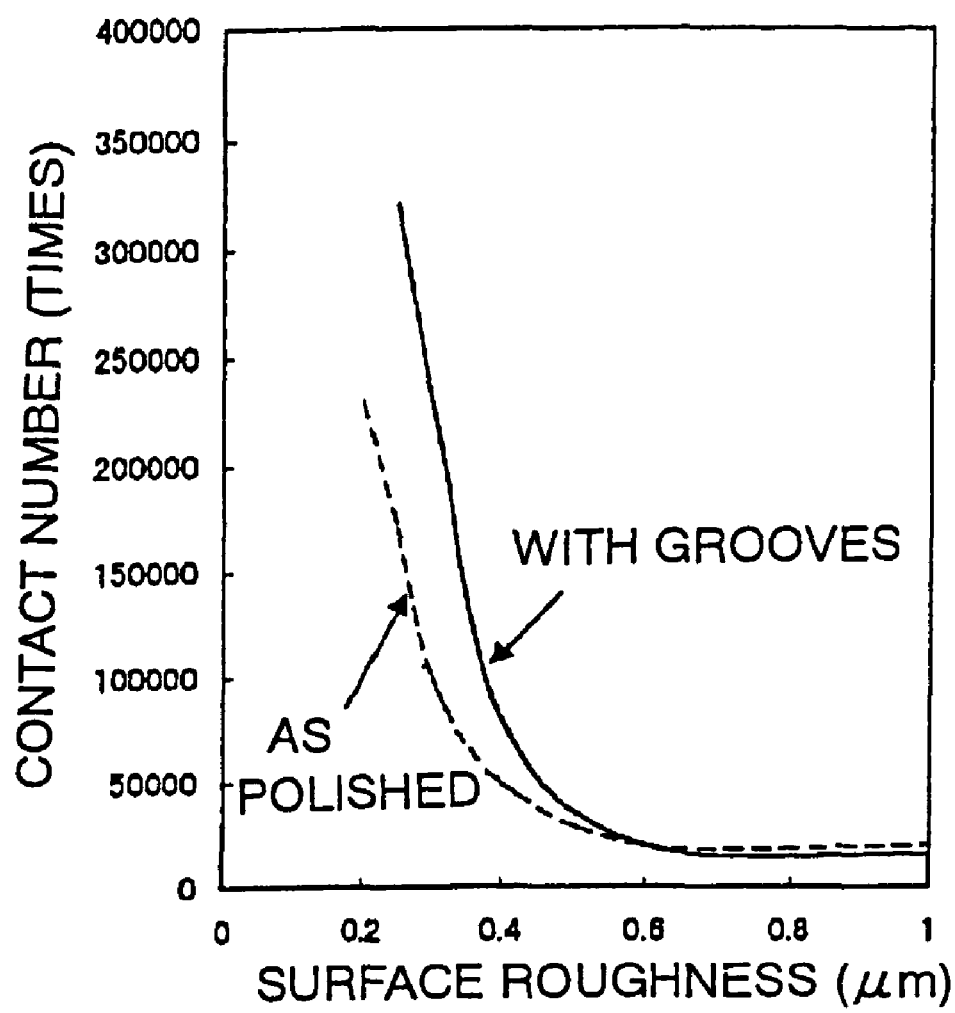
FIG. 10 is a graph showing the relationship between the surface roughness of the probe of the third embodiment of the present invention and the number of times of contact achieved until the contact resistance exceeds 1 ohm.

FIG. 9a is an explanatory side view of the probe of the third embodiment of the present invention and FIG. 9b is an explanatory bottom view of the probe shown in FIG. 9a. In the figures, the probe 1 has at its tip portion a plurality of radial grooves 17. As in the above second embodiment, the surface of the probe having a radius of curvature of 15 µm is finished at various surface roughness and the grooves 17 which are abrasion scratches extending from the center of the probe in the radial direction through the use of abrasion particles. Such the probes were used in the test of DRAM's of which electrode pad are about 0.8 µm. FIG. 10 is a graph showing the relationship between the surface roughness of the probe of the third embodiment of the present invention and the number of times of contact achieved until the contact resistance exceeds 1 ohm, also showing for comparison purpose the data of the probe (broken line) to which only a typical abrasion is achieved and random-oriented scratches are formed. It is seen from the graph that the probe having radially extending grooves is significantly higher number of times of contact as compared with a typical probe simply polished. The reason for this is considered that, when the probe is pressed and scrubbed against the electrode pad, the metal such as aluminum of the electrode pad plastically flows along the radially extending grooves without mechanically engaging at the random scratches or step-like portions due to the abrasion scratches, whereby the chance of the pad metal such as aluminum attaches to the tip portion of the probe and oxidizes to increase the contact resistance is increased.

Figure 11A:
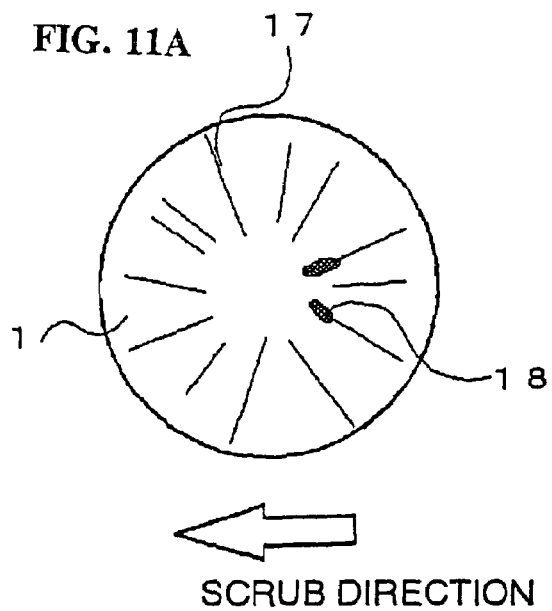
FIG. 11a is a diagrammatic illustration of the results of the SEM observation of the probe according to the third embodiment of the present invention, wherein the radial grooves are provided.
Figure 11B:
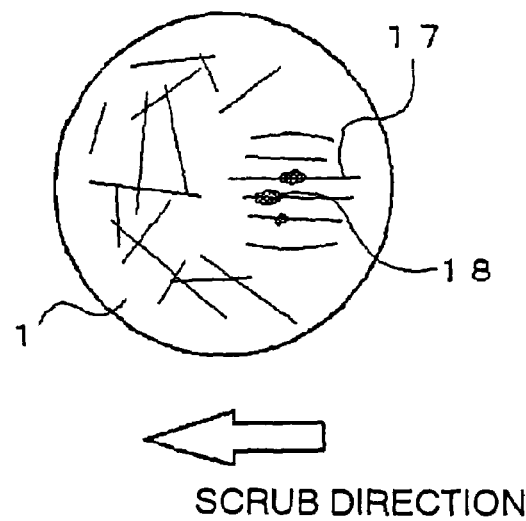
FIG. 11b is a diagrammatic illustration of the results of the SEM observation of the probe according to the third embodiment of the present invention, wherein some of the grooves are parallel to each other.
Figure 11C:
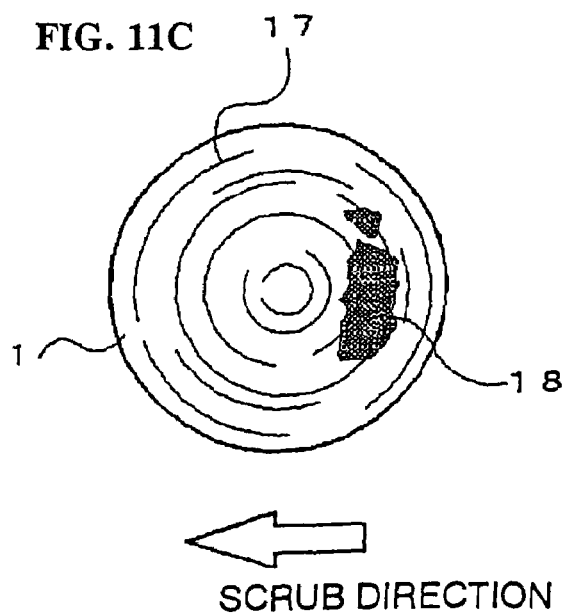
FIG. 11c is a diagrammatic illustration of the results of the SEM observation of the probe according to the third embodiment of the present invention, wherein the concentric grooves are provided.
Figure 11D:
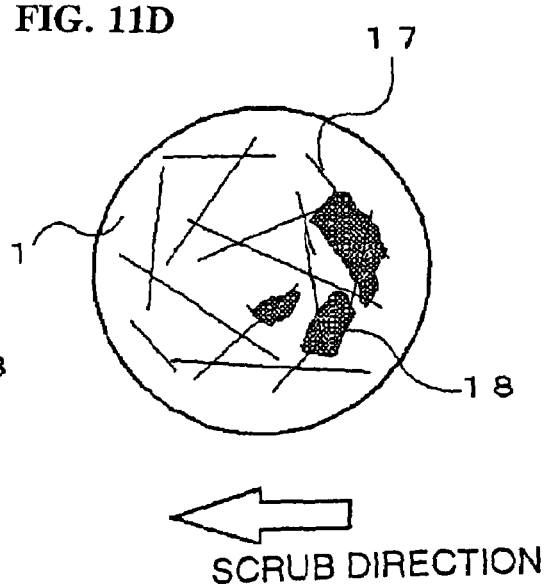
FIG. 11d is a diagrammatic illustration of the results of the SEM observation of the probe according to the third embodiment of the present invention, wherein the grooves are randomly oriented.

In order to confirm the above phenomenon, various probes with grooves manufactured with abrasive of 5 µm grain size in various condition are urged against the electrode pad of the DRAM's and observed by a scanning electron microscope (SEM). FIG. 11a is a diagrammatic illustration of the results of the SEM observation of the probe 1 according to the present invention wherein some of the radial grooves 17 have attached thereto attachments 18. In FIG. 11b, some of the grooves 17b positioned at least at the position brought into contact with the electrode pad are made parallel to each other. In FIG. 11c, the probe 1 has concentric grooves 17c, and in FIG. 11d the probe 1 has grooves 17d that are randomly oriented. When these probes 1 are urged against the electrode pad in the direction indicated by a white arrow, some attachments 18 which are believed to be aluminum or its oxide are observed as shown in the figures. It is understood from these observations that much attachment of aluminum or its oxide is observed on the probes shown in FIGS. 11c and 11d and a very small amount of attachment of aluminum or its oxide is observed on the probes shown in FIGS. 11a and 11b and that the attachment to the probes can be prevented by forming the scratches or grooves 18 substantially along the direction of movement of the scrubbing.

In order to form grooves substantially parallel to the direction of scrubbing on the tip portion of the probe, the tip portion is first worked by the abrasion using an ordinary electrolyte liquid or Si abrasion grains into a desired spherical shape. Then, in order to form the grooves in radial direction, the probe is inserted in the substantially vertical direction into the abrasion grains, or a substrate or a film in which the abrasion grains are embedded within a resin such as polyimide. Alternatively, in order to form the parallel grooves, the probe is moved on the abrasion grains, or on the film in which the abrasion grains just mentioned above are embedded or a substrate on which an abrasion material film is formed. The abrasion grains used may be Si, SiC, Artificial diamond or the like, and should preferably have the grain size of equal to or less than 5 µm in order to form the grooves of the above embodiments. Also, the film into which the abrasion grains are embedded may be manufactured by mixing the abrasion grains in the resin and by securing.

Figure 12A:
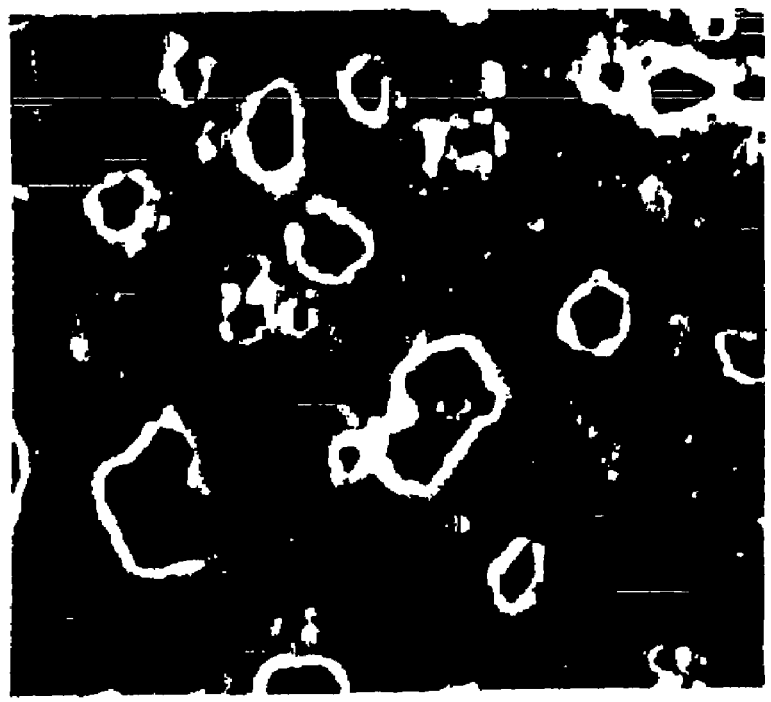
FIG. 12a is a diagrammatic illustration of the results of the SEM observation of the typical tungsten probe.
Figure 12B:
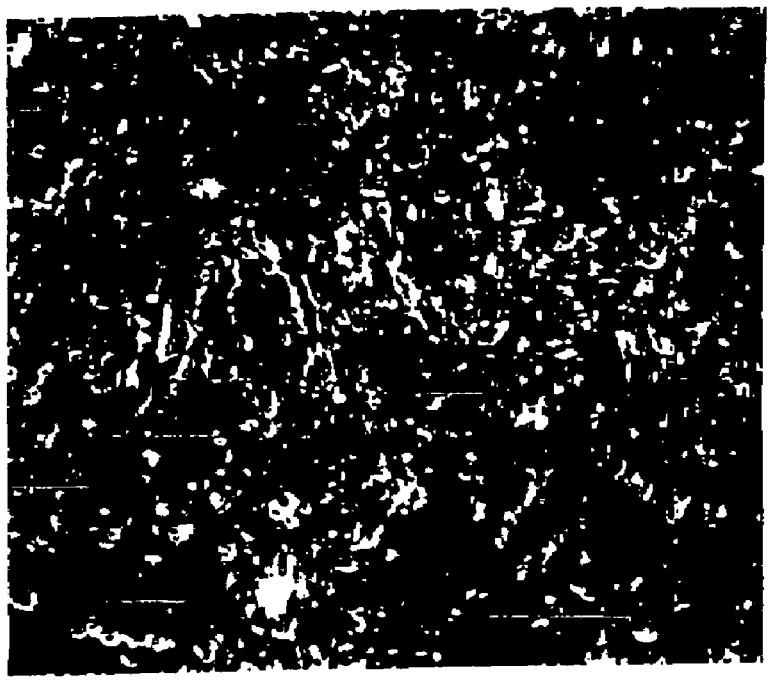
FIG. 12b is a diagrammatic illustration of the results of the SEM observation of the tungsten probe after the heat treatment according to the present invention.
Figure 13A:
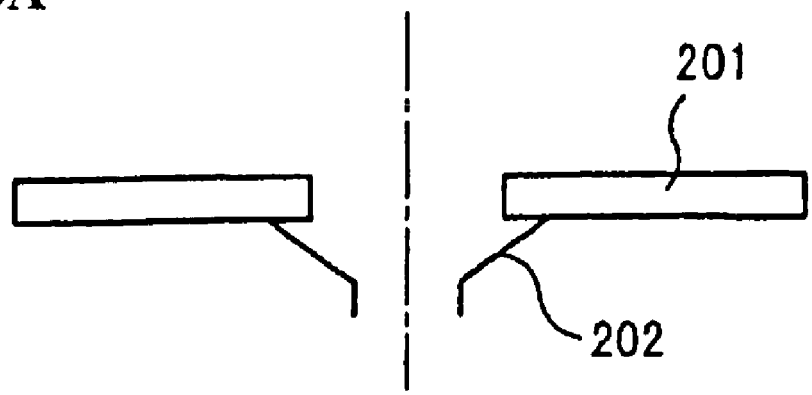
FIG. 13a is an explanatory view of the conventional probe device.
Figure 13B:
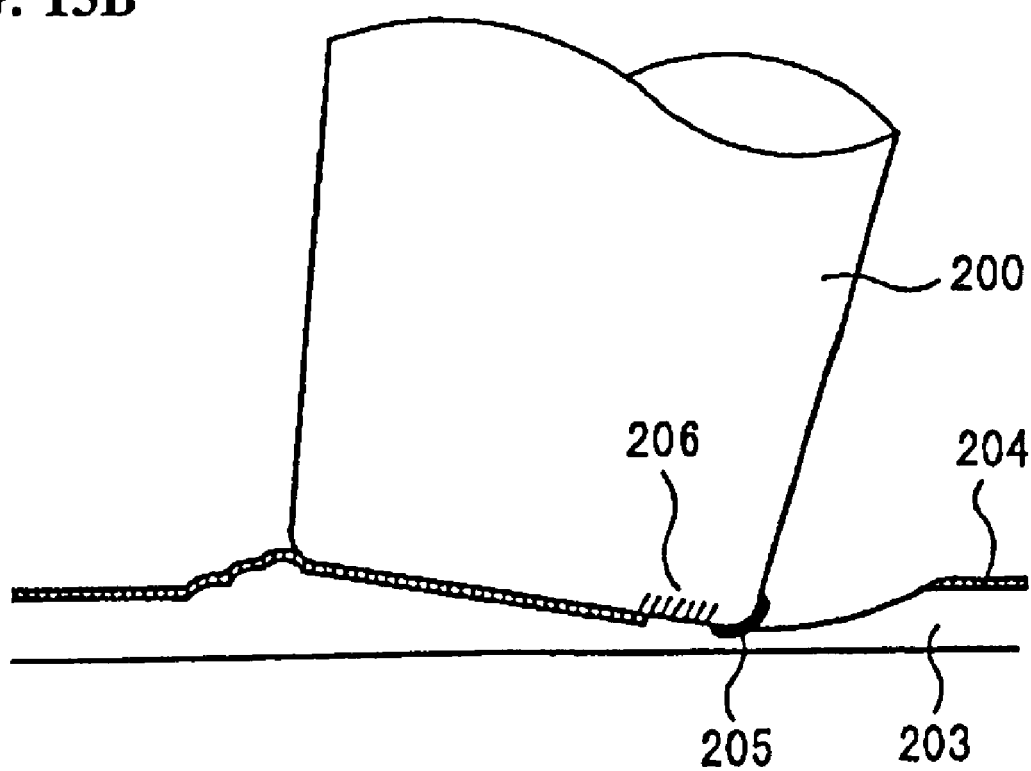
FIG. 13b is an enlarged view of the tip of the conventional probe shown in relation to the electrode pad.
Figure 14:
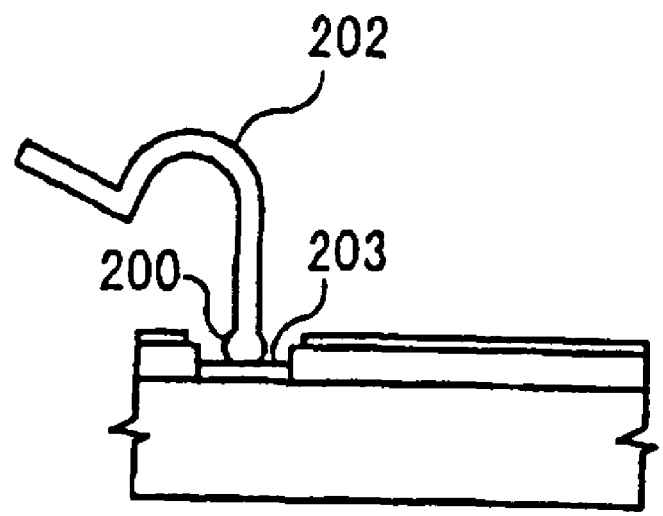
FIG. 14 is an explanatory view illustrating the conventional probe.
Figure 15:
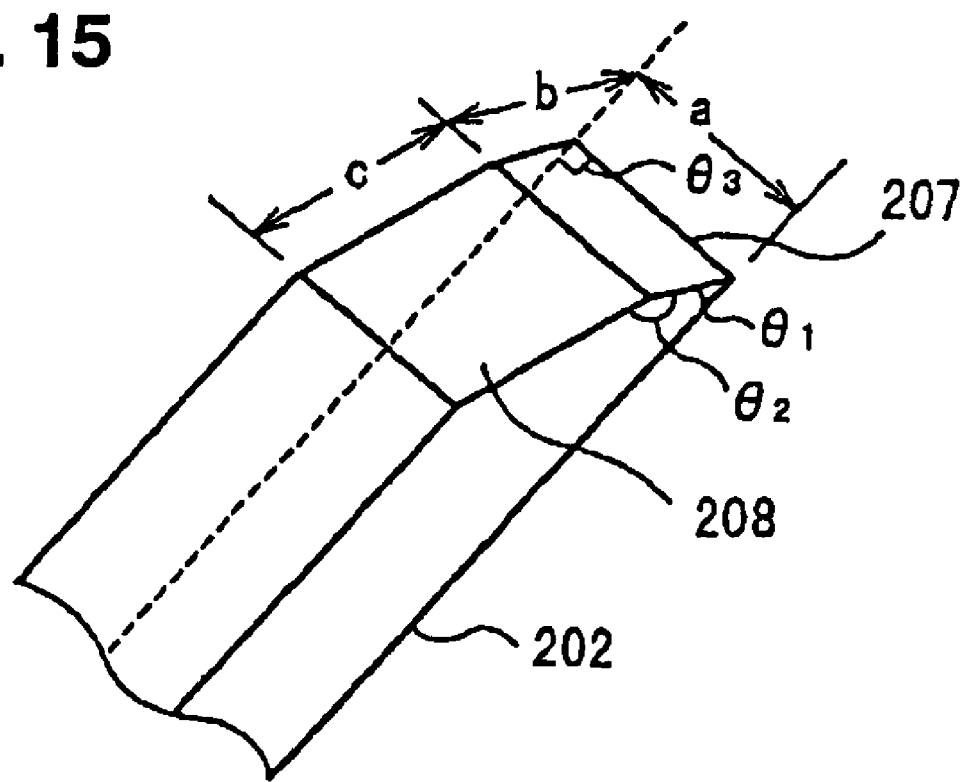
FIG. 15 is an explanatory view illustrating another conventional prove.

FIG. 12a is a diagrammatic illustration of the results of the scanning electron microscope (SEM) observation of the system of the typical tungsten probe and FIG. 12b is a diagrammatic illustration of the results of the scanning electron microscope (SEM) observation of the tungsten probe after the heat treatment according to the present invention. In order to collapse the voids contained in the tungsten probe which is made of a sintered porous material, the sintered material is rolled by machining and wire-drawn into a wire to provide needle crystalline system. The voids or cavities however still remain by 1–2% and it is therefore desirable to apply the heat treatment for collapsing the cavities includes. However, when the heat treatment at the recrystallization temperature range for the tungsten material is achieved, the needle-like crystal system of the tungsten material is destroyed and the probe becomes brittle to deteriorate the strength of material inherent to tungsten is deteriorated, so that it is not possible to apply such the heat treatment to the thin probe such as that used in the present invention. Thus, according to the present invention, a high pressure is applied to the probe from outside at a relatively low temperature so that the multiplier effect of temperature and pressure is utilized to collapse the cavities within the tungsten material.

The metallic material wire-drawn such as the probe has a pretty high work strain (residual stress) within the material. Due to this work strain, the chemical potential energy of the metal atoms arranged at random particularly around the crystal grain boundary. Accordingly, this metallic material high in the work strain is heated to a temperature equal to or less than the recrystallization temperature and put it under a hydraulic pressure from the outside to collapse the cavities positioned around the crystal grain boundary within the metallic material. The heat treatment was achieved at a temperature equal to or less than the recrystallization temperature of the bulk material, the pressure is equal to or more than that needed to generate the slip of the material and the treatment time lasts until almost all of the movement of the atoms of the metallic material to be treated comes to stop. More particularly, the treatment temperature is 300° C.–600° C., the treatment pressure is 200–2000 atms and the treatment time is 0.5 to 5 hours, whereby the cavities can be decreased. I was determined from the experiment that the cavities are significantly reduced particularly when the treatment temperature is 500° C., the treatment pressure is equal to or more than 1000 atmospheric pressure and the treatment time is equal to or more than 1 hour.

As for the pressure conditions, the processing time is shorter when the pressure is higher. While the typical cavity collapsing heat treatment is achieved at a temperature equal to or above the recrystallization temperature of the material (usually a temperature 4–5 times higher the melting point of the material) and under a high pressure (referred to as HIP treatment), according to the present invention, the cavities are collapsed by the heat treatment at a temperature one digit lower as compared to the melting point 3,400° C. of the tungsten as shown in FIGS. 12a and 12b. Also the brittleness of the material is not increased as compared to the heat treatment at or above the recrystallization temperature. With a thick probe of a diameter of about 5 mm, the above heat treatment with the above heat treatment conditions was achieved and confirmed that the cavity defects were remained. That is it was determined that the heat treatment of the present invention should be achieved after the wire drawing process to the size of the probe of the order of 150 μm–300 μm.

Further, it was found that this heat treatment causes the crystal orientation to be significantly coincided with the direction of wire drawing of the probe and that the etching rate and abrasion rate upon working the probe tip portion becomes uniform due to this effect, allowing the tip of the probe to be a very smooth flat surface. This causes the probe tip to be difficult to be attached by he oxides, realizing a probe of a good electrical conduction. The surface roughness of the flat surface may preferably be equal to or less than 0.4 μm.

Also, since the mechanical properties are even (The Young's modulus after the treatment was 22.3–26.3 kgf/mm$^2$ while the Young's module before treatment was 18.8–25.2 kgf/mm$^2$.), an excessive over-drive and the load can be decreased in view of the deviation of the probe by the probing through the use of the probe card to which the probe is attached.

|  | tensile load | Young's modulus |
| --- | --- | --- |
|  | gf | x103 kgf/mm$^2$ |
| sample before treatment | 12.800 | 18.8 |
|  | 12.960 | 25.2 |
|  | 12.060 | 18.8 |
| after treatment | 13.520 | 22.3 |
|  | 13.800 | 23.8 |
|  | 13.840 | 26.3 |

By using this heat-treated probe material, the probe having the radius of curvature of the tip of 25 μm according to the first embodiment is used, then the number of times at which the continuous probing for the stable electrical contact resistance is possible was improved as compared to the first embodiment to more than 200,000 times, resulting in the significant reduction of the test time and costs.

While the description has been made mainly in terms of the probe and the probe card for testing wafer of the semiconductor integrated circuit, according to the contact method of the present invention, a final test of an electrical conduction can be achieved by the concept of the present invention in case of the contact to the lead frame after the semiconductor integrated circuit is packaged, for example. Also, the probe can be applied to the operational test of an electronic circuit board to which a semiconductor integrated circuit or display device or the like is mounted.

As has been described, according to the semiconductor device test probe of the present invention, the tip portion defining a spherical surface has a radius of curvature r expressed by $9t \leq r \leq 35t$, where r is the radius of curvature of the spherical surface and t is the thickness of the electrode pad, so that the probe tip can efficiently shear and deform the electrode pad during the probing to establish a sufficient electrical conduction between the probe tip and the electrode pad, enabling a reliable electrical property test of the semiconductor device.

Also the tip portion defining a spherical surface has a first curved surface substantially positioned in the direction of slippage of the probe when the probe is urged against the electrode pad and slipped relative to the electrode pad and a second curved surface opposite to the first curved surface, and the first curved surface having a radius of curvature of from 7 μm to 30 μm and larger than that of the second curved surface, so that the probe tip can efficiently shear and deform the electrode pad during the probing to form a small contacting surface that establishes a sufficient electrical conduction between the probe tip and the electrode pad without the need for the cleaning of the probe tip, enabling that the semiconductor device be not damaged and no poor bonding is generated.

Also, the method for manufacturing the semiconductor device test of the present invention comprises the steps of roughing the tip portion of the curved surface by abrasing by means of electrolyte abrasion or abrasing particles to form a symmetrical spherical curved surface, and finishing the tip portion by sliding it on an abrasive member comprising an elastically deformable thick film fixed to a substrate and having abrasive particles therein or thereon directly or through a metallic film, so that it is possible to easily manufacture the probe tip that can efficiently shear and deform the electrode pad during the probing to form a small contacting surface that establishes a sufficient electrical conduction between the probe tip and the electrode pad without the need for the cleaning of the probe tip, enabling that the semiconductor device be not damaged and no poor bonding is generated.

Also, according to the semiconductor device test probe of the present invention, the surface roughness of the tip portion of the probe is equal to or less than 0.4 μm, so that the attachment of the oxide to the probe tip can be prevented and therefore the stable electrical conduction can be continuously maintained.

Also, according to the semiconductor device test probe of the present invention, the tip portion of the probe comprises fine grooves extending in the direction of scrub of the probe against the electrode pads, so that the attachment of the oxide to the probe tip can be prevented and therefore the stable electrical conduction can be continuously maintained.

Further, the method for manufacturing the semiconductor device test probe of the present invention comprises the steps of working curved surface of the tip portion into a substantially spherical curved surface by abrasing by means of electrolyte abrasion or abrasing particles to form a symmetrical spherical curved surface, and inserting or moving the tip portion into the abrasive particles or on a resin including the abrasive particles to form fine grooves extending in the direction of scrub of the probe against the electrode pads, so that the attachment of the oxide to the probe tip can be prevented and therefore the stable electrical conduction can be continuously maintained.

Also, according to the semiconductor device test probe of the present invention, the probe is made of a metallic material made from a powdery material, and the probe is heat treated, the heat treatment conditions being a non-oxidizing atmosphere, at the treatment temperature of equal to or less than the recrystallization temperature of the metallic material and the non-oxidizing gas is pressurized, so that the cavity defects in the probe are decreased and the mechanical property is uniform, the attachment of the oxide to the probe tip can be prevented and therefore the stable electrical conduction can be continuously maintained.

Further, according to a semiconductor device of the present invention, the test is achieved by urging the probe against the electrode pad of the semiconductor device, providing a relative sliding movement between the probe and the electrode pad to expel the electrode pad material by making a lamination stack, so that the generation of the poor wire-bonding can be prevented.

What is claimed is:

1. A semiconductor device test probe comprising a tip portion for being urged against an electrode pad of an integrated semiconductor device to establish an electrical contact between the tip portion and the electrode pad for testing an operation of the semiconductor;

said test probe having a side surface portion and a tip portion, said tip portion defining a spherical surface and said spherical surface having a radius of curvature r expressed by 10 $\mu m \leq r \leq 20$ $\mu m$, and said tip portion having a surface roughness equal to or less than 0.4 $\mu m$.

2. A probe card having a plurality of probes which can be brought into contact with a plurality of electrode pads to test the semiconductor device, wherein the card comprises the probe of claim 1.

3. A semiconductor device test probe comprising a tip portion for being urged against an electrode pad of an integrated semiconductor device to establish an electrical contact between the tip portion and the electrode pad for testing an operation of the semiconductor;

said test probe having a side surface portion and a tip portion, said tip portion defining a spherical surface and said spherical surface having a radius of curvature r expressed by 10 $\mu m \leq r \leq 20$ $\mu m$, said tip portion generating a shear deformation on the electrode pads, and said tip portion having a surface roughness equal to or less than 0.4 $\mu m$.

4. A probe card having a plurality of probes which can be brought into contact with a plurality of electrode pads to test the semiconductor device, wherein the card comprises the probe of claim 3.

* * * * *